United States Patent
Walker et al.

(10) Patent No.: US 7,102,375 B2
(45) Date of Patent: Sep. 5, 2006

(54) PIN ELECTRONICS WITH HIGH VOLTAGE FUNCTIONALITY

(75) Inventors: Ernest Walker, Weston, MA (US); Ronald A. Sartschev, Dunstable, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 11/023,023

(22) Filed: Dec. 23, 2004

(65) Prior Publication Data

US 2006/0139048 A1 Jun. 29, 2006

(51) Int. Cl.
*G01R 31/02* (2006.01)
(52) U.S. Cl. .................. 324/761; 324/765; 324/158.1; 714/724; 714/733
(58) Field of Classification Search ............. 324/158.1, 324/765; 714/724, 733
See application file for complete search history.

(56) References Cited

U.S. PATENT DOCUMENTS

| | | | |
|---|---|---|---|
| 5,101,153 A | 3/1992 | Morong, III | |
| 5,200,696 A | 4/1993 | Menis et al. | |
| 5,514,976 A | 5/1996 | Ohmura | |
| 5,521,493 A | 5/1996 | Persons | |
| 5,617,035 A | 4/1997 | Swapp | |
| 6,498,473 B1 | 12/2002 | Yamabe | |
| 6,677,775 B1 | 1/2004 | Babcock | |
| 6,687,868 B1 * | 2/2004 | Furukawa et al. | 714/740 |
| 6,828,775 B1 | 12/2004 | Chow et al. | |
| 6,836,136 B1 | 12/2004 | Aghaeepour | |
| 6,859,902 B1 * | 2/2005 | Dalal et al. | 714/726 |
| 6,879,175 B1 | 4/2005 | Conner | |
| 6,885,213 B1 | 4/2005 | Sunter | |
| 2005/0189950 A1 | 9/2005 | Lu | |

* cited by examiner

*Primary Examiner*—Vinh Nguyen
*Assistant Examiner*—Arleen M. Vazquez
(74) *Attorney, Agent, or Firm*—Fish & Richardson P.C.

(57) ABSTRACT

In one aspect, the invention is an integrated circuit (IC) for use in testing a device. The IC includes a pin electronics (PE) driver having an output and a pin. The IC also includes a buffer connected to the output of the PE driver and the pin. The first voltage measured at the pin is greater than a second voltage measured at the output. The IC may include a first amplifier having an input connected to a voltage source. The IC may also include a second amplifier having an input connected to the output of the PE driver.

13 Claims, 8 Drawing Sheets

US 7,102,375 B2

PIN ELECTRONICS WITH HIGH VOLTAGE FUNCTIONALITY

TECHNICAL FIELD

This patent application relates generally to testing a device and, more particularly, to pin electronics.

BACKGROUND

Automatic test equipment (ATE) refers to an automated, usually computer-driven, approach to testing devices, such as semiconductors, electronic circuits, and printed circuit board assemblies, for example. Pin electronics (PE) are generally part of an ATE. PE electronics typically provide driver, comparator and/or active load functionality for testing a device-under-test (DUT).

SUMMARY

In testing some devices, higher voltages are required than those traditionally provided by the PE. Typically, a higher voltage than provided by the pin electronics is provided by boards external to the PE. This application provides methods and apparatus, including circuitry and computer program products, for using PE to provide high voltage functionality on a single integrated circuit (IC) or chip.

In one aspect, the invention is an integrated circuit (IC) for use in testing a device. The IC includes a pin electronics (PE) driver having an output, a pin and a buffer connected to the output of the PE driver and the pin. The first voltage measured at the pin is greater than a second voltage measured at the output.

In another aspect the invention is automatic test equipment (ATE) for use with a device under test. The automatic test equipment includes an integrated circuit (IC). The IC includes a pin electronics (PE) driver having an output having a second voltage, a high voltage pin having a first voltage being greater than the second voltage and a buffer connected to the output of the PE driver and the high voltage pin.

One or more of the aspects above may have one or more of the following features. The buffer includes a first amplifier having an input connected to a voltage source. The voltage source corresponds to the terminal voltage used by the PE driver. The gain of the first amplifier has a gain greater than one. The buffer includes a second amplifier having an input connected to the output of the PE driver. The second amplifier has a gain of about one. The buffer includes a switching mechanism configured to establish, in a first mode, a first electrical connection between the first amplifier and the pin, and, in a second mode, to establish a second electrical connection between the second amplifier and the pin. The first mode and the second mode are mutually exclusive. The pin electronics driver is tri-stated and includes an enable input signal and the switching mechanism includes an input signal to establish the first mode or the second mode. The input signal of the switching mechanism and the enable input signal are the same. The switching mechanism comprises a first switch and a second switch.

In still another aspect, the invention is a method of testing a device. The method includes connecting an output of a pin electronics driver to a buffer, connecting the buffer to a pin and providing a first voltage at the pin greater than a second voltage at the output of the PE driver.

This aspect may include one or more of the following features. The buffer includes a first amplifier having a gain of one and including an input connected to the output of the PE driver and a second amplifier having a gain greater than one and including an input connected to a voltage source. The method may include receiving a signal indicating a first mode or a second mode; in the first mode, establishing a first electrical connection between the first amplifier and the pin; and in the second mode, establishing a second electrical connection between the second amplifier and the pin. The first mode and the second mode may be mutually exclusive.

The PE described herein provides high voltage (HV) functionality with the same IC as the PE and thus provides savings in board space and design cost. The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
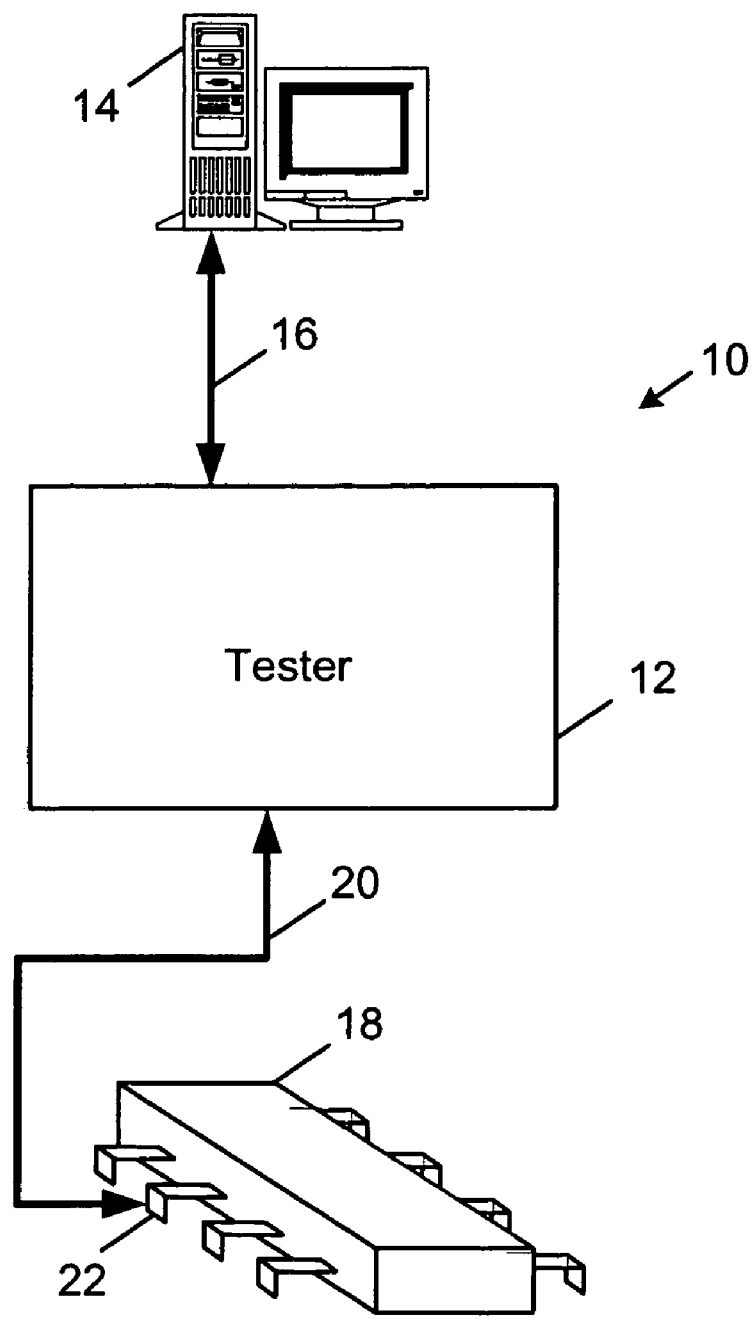
FIG. 1 is a diagrammatic view of a system for testing devices.

Referring to FIG. 1, a system 10 for testing a device-under-test (DUT) 18 such as semiconductor devices includes a tester 12 such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collecting responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example semiconductor device tester 12 is connected to one connector pin of DUT 18 by a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals into other pins and collect associated signals reflected back over conductors (that deliver the provided signals). By collecting the reflected signals, the input impedance of the pins may be characterized along with other single port testing quantities. In other test scenarios a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine such quantities as gain response, phase response, and other throughput measurement quantities.

Figure 2:
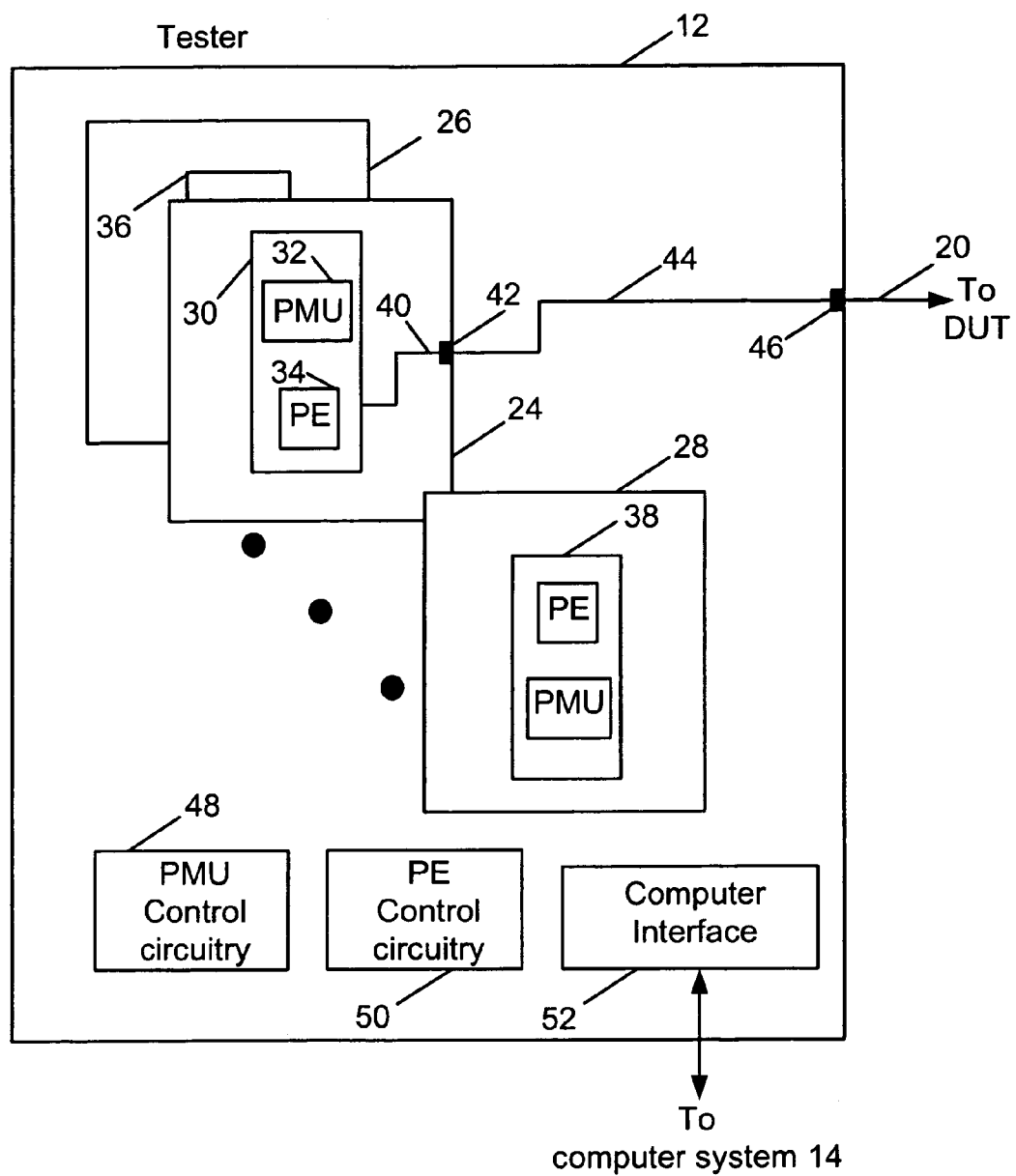
FIG. 2 is a diagrammatic view of a tester.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect the corresponding responses. Each communication link to a pin is typically referred to as a channel and by providing test signals to a large number of channels, testing time is reduced since multiple tests may be simultaneously performed. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and Pin electronics (PE) tests. IC chip 30 respectively has a PMU stage 32 that includes circuitry for performing PMU tests and a PE stage 34 that includes circuitry for performing PE tests. Additionally interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., DUT 18) and collecting responses to further characterize the performance of the DUT. For example, IC chip 30 may transmit (to the DUT) AC test signals that represent a vector of binary values for storing on the DUT. Once stored, the DUT is accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals and waveforms from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46 that allows signals to be passed to and from tester 12. In this example conductor 20 is connected to interface connector 46 for bidirectional signal passing between tester 12 and pin 22 of DUT 18. In some arrangements an interface device may be used to connect one or more conductors from tester 12 to the DUT. For example, the DUT (e.g., DUT 18) may be mounted onto a device interface board (DIB) for providing easy access to each DUT pin. In such an arrangement, conductor 20 may be connected to the DIB for placing test signals on the appropriate pin(s) (e.g., pin 22) of the DUT.

In this example only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. Tester 12 also includes a computer interface 52 that allows computer system 14 to control the operations executed by tester 12 and also allows data (e.g., test parameters, DUT responses, etc.) passing between tester 12 and computer system 14.

Figure 3A:
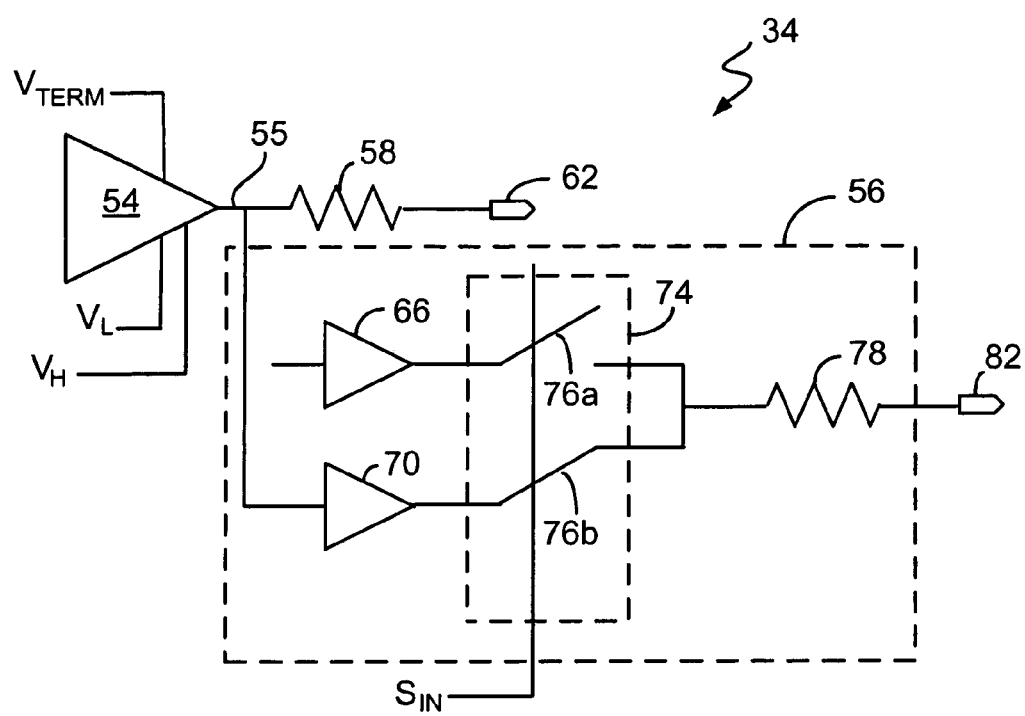
FIG. 3A is an integrated circuit diagram for providing a high voltage function using pin electronics (PE) in a first mode.
Figure 3B:
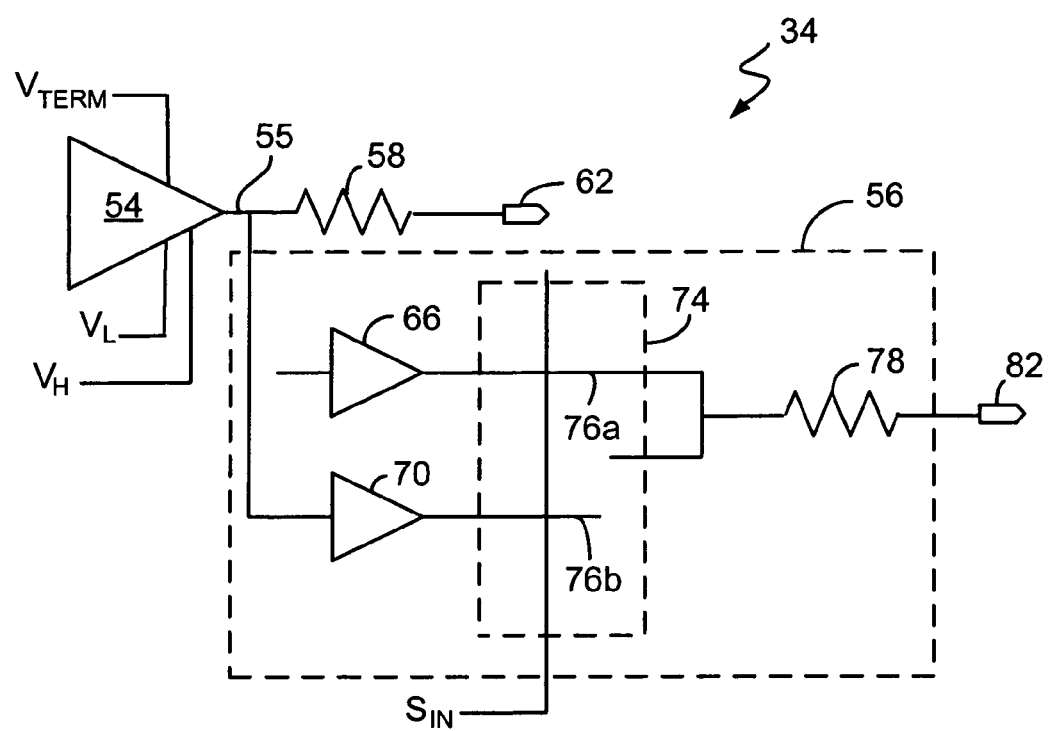
FIG. 3B is an integrated circuit diagram for providing a high voltage function using pin electronics (PE) in a second mode.

Referring to FIGS. 3A and 3B, pin electronics 34 includes a pin electronics (PE) driver 54 having an output 55, a buffer 56 connected to the output 55 of the PE driver 54, a matched resistor 58 connected to the output of the PE driver, a test pin 62 connected to the matched resistor 58 and a high voltage pin 82 connected to the buffer 56. PE driver 54 receives input signals, which control the operation of the PE driver, for example, a voltage low ($V_L$), a voltage high ($V_H$) and a termination voltage ($V_{TERM}$). As will be described below, the PE circuitry may be used to generate high voltages at the high voltage pin 82. In this disclosure, the term "high voltage" means a voltage that is a higher voltage than what is provided at the output 55 of the PE driver 54.

Buffer 56 includes a first amplifier 66, a second amplifier 70, and a switching mechanism 74, which includes a switch 76a and a switch 76b and a matched resistor 78. An input of amplifier 66 is connected to $V_{TERM}$ and an output of amplifier 66 is connected to switch 76a. By using an already existing voltage source with the pin electronics such as $V_{TERM}$, a new voltage source does not need to be added. An input of amplifier 70 is connected to the output 55 of PE driver 54 and an output of amplifier 70 is connected to switch 76b.

In one embodiment, amplifier 66 has a gain of about 2.33, amplifier 70 has a gain of 1 and matched resistor 78 is about 50 ohms. The voltage at the output 55 of the PE driver 54 ranges from 0 to 6 volts. $V_{TERM}$ ranges from 0 to 6 volts and the voltage at the high voltage pin 82 ranges from 0 to 14 volts.

In a first mode (FIG. 3A), switch mechanism 74 includes switch 76a in an open circuit and switch 76b in a closed circuit. When activated by an input signal, $S_{IN}$, switch mechanism 74 transitions into a second mode (FIG. 3B). The second mode includes switch 76a in a closed circuit and switch 76b in an open circuit. The input signal, $S_{IN}$, may also transition switch mechanism 74 transitions from the second mode to the first mode.

In one embodiment, switch 76a and switch 76b move simultaneously so that neither switch 76a nor switch 76b is in a closed position at the same moment. Thus, switch mechanism 74 is either in the first mode or the second mode.

Figure 4A:
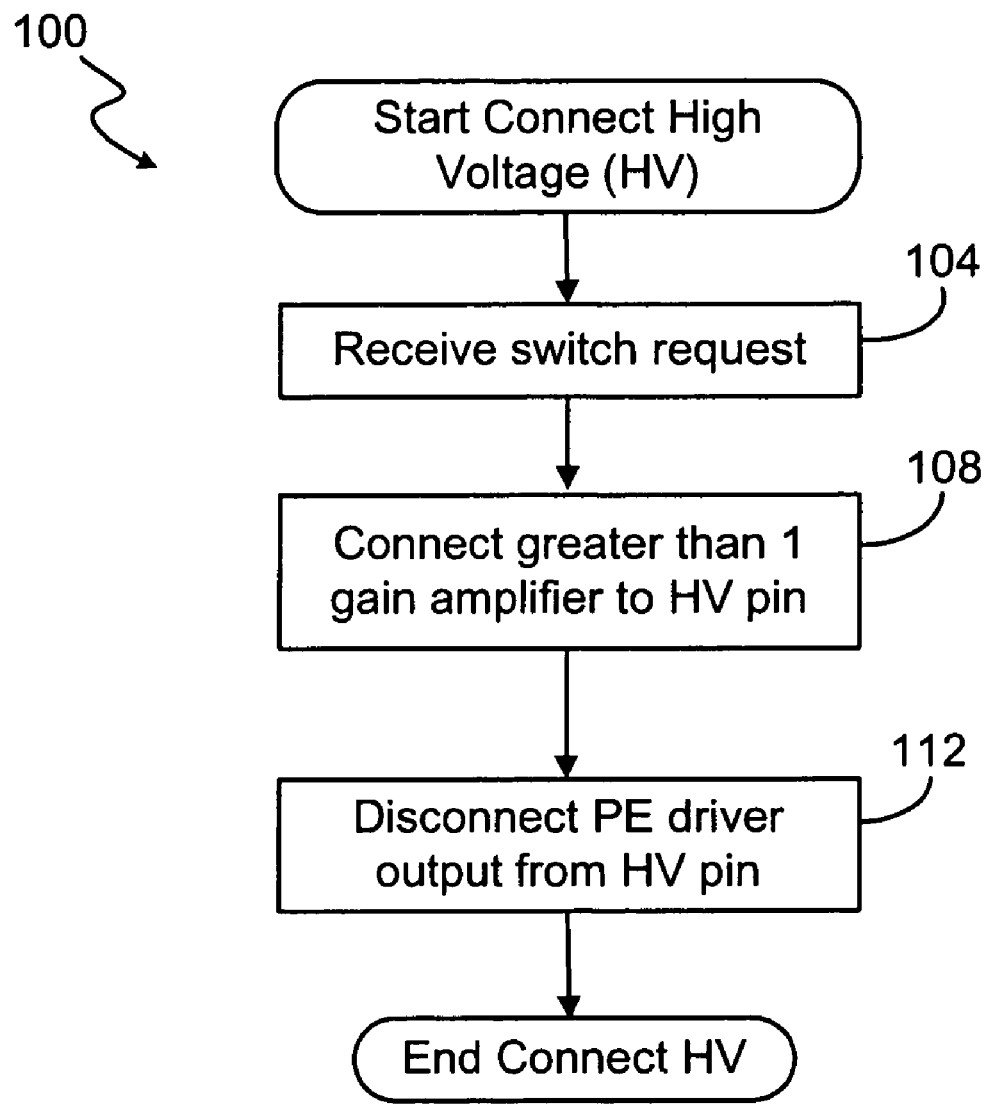
FIG. 4A is a flowchart showing a process for implementing a high voltage function using pin electronics.

FIG. 4A is a flowchart showing a process 100 for implementing high voltage functionality using software to select a high voltage by transitioning from the first mode to the second mode. Process 100 receives (104) an input to switch the high voltage pin 82 to a high voltage. Process 100 connects (108) amplifier 66 to HV pin by closing switch 76a. Process 100 disconnects (112) PE driver 54 from HV voltage pin 82 by opening switch 76b.

Figure 4B:
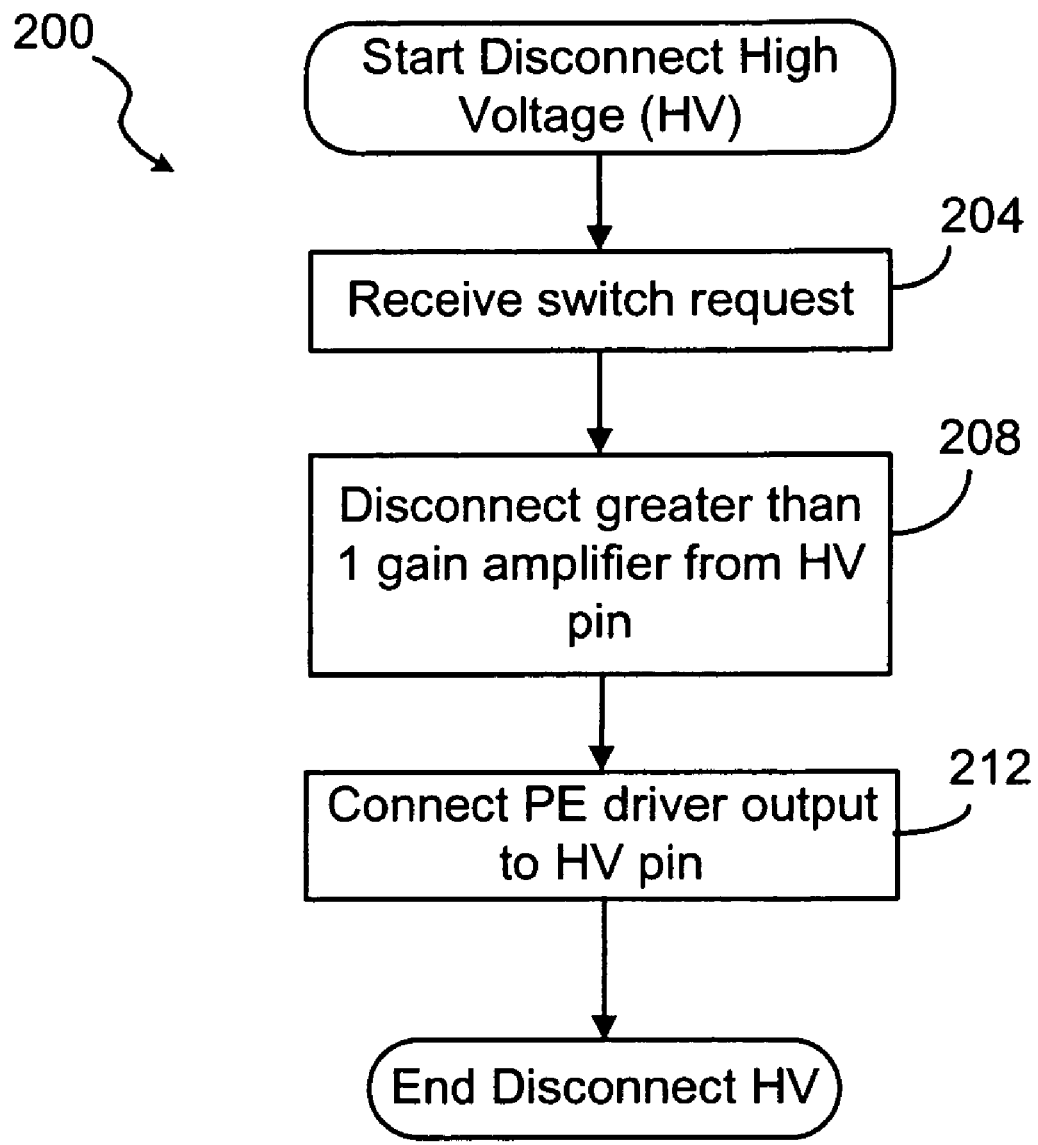
FIG. 4B is a flowchart showing a process for deactivating a high voltage function.

Referring to FIGS. 4A and 4B, FIG. 4A may be modified to transition from the second mode to the first mode by performing the opposite actions in block 108 and 112. For example, process 200 receives (204) an input to remove the high voltage from the high voltage pin 82. Process 200 disconnects (208) amplifier 66 from HV pin 82 by opening switch 76a. Process 200 connects (212) PE driver 54 to HV voltage pin 82 by closing switch 76b.

Figure 5A:
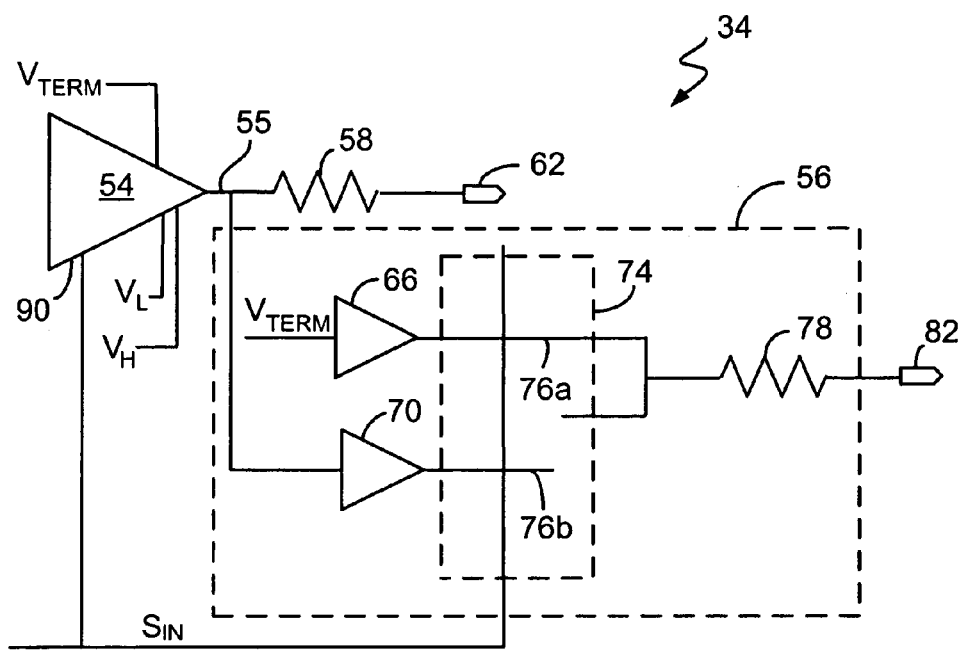
FIG. 5A is an integrated circuit diagram with a tri-state PE driver with the high voltage functionality enabled.
Figure 5B:
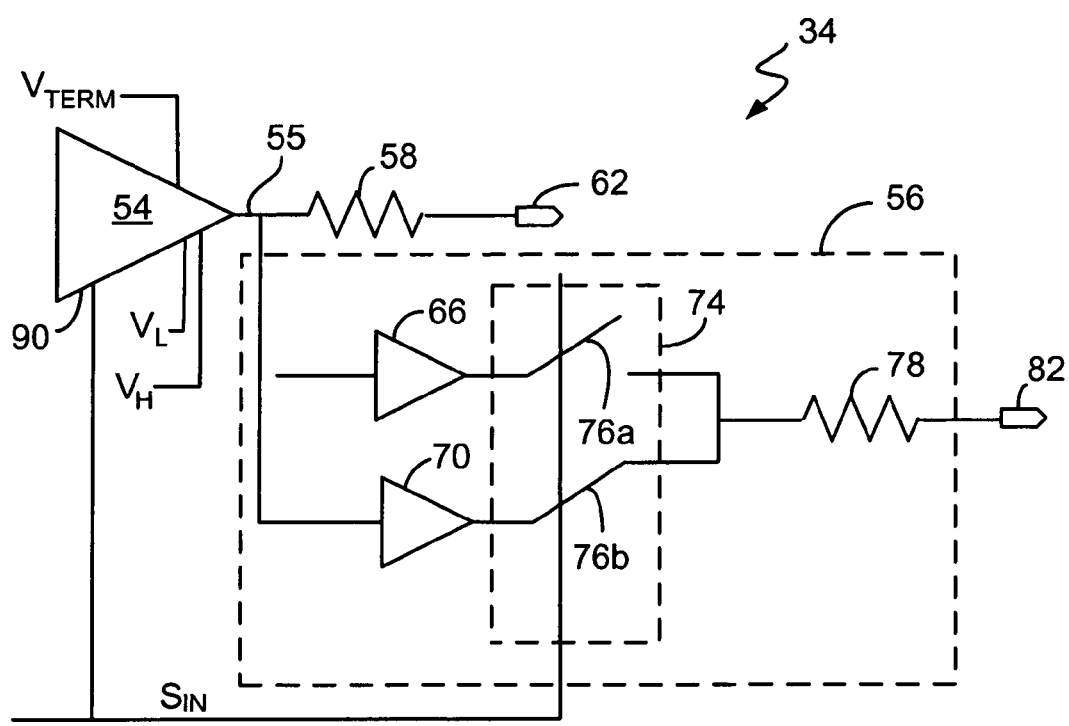
FIG. 5B is an integrated circuit diagram with a tri-state PE driver with the high voltage functionality disabled.

Referring to FIGS. 5A and 5B, in some embodiments, PE driver 54 may be tri-stated to prevent driver 54 from outputting current and/or voltage. In this regard, a tri-state circuit, such as driver 54, is similar to an ordinary circuit, except that it has an additional input 90 called the "enable" input. When the enable input is "0", the tri-state circuit behaves like a corresponding normal (non-tri-state) circuit. When the enable input is "1", the output of the tri-state circuit (in this case, driver 54) is disconnected from the rest of the circuit. Thus, as here, when driver 54 is tri-stated, its output is disconnected from resistor 58 and buffer 56, preventing driver 54 from supplying current and/or voltage to pin 62 and pin 82. In some embodiments, the signal $S_{IN}$ may be tied to the input 90. When the input 90 is "1", PE driver 54 is "off," switch 76a is "closed" and switch 76b is "open" (see FIG. 5A). When the enable input is "0", PE driver is "on," switch 76b is "closed" and switch 76a is "open" (See FIG. 5B).

The tester described herein is not limited to use with the hardware and software described above. The tester can be implemented in digital electronic circuitry, or in computer hardware, firmware, software, or in combinations thereof.

The tester can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the tester can be performed by one or more programmable processors executing one or more computer programs to perform the functions of the tester. All or part of the tester can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Processes 100 and 200 are not limited to the specific embodiments described herein. For example, processes 100 and 200 are not limited to the specific processing order of FIGS. 4A and 4B. Rather, the blocks of FIGS. 4A and 4B may be re-ordered or removed, as necessary, to achieve the results set forth above. For example, blocks 108 and 112 in process 100 and blocks 212 and 208 in process 200 may be reordered or performed simultaneously.

The circuitry is not limited to the specific examples described herein. For example, while this disclosure describes circuitry within automatic test equipment, the circuitry described herein may be used in any circuit environment requiring high voltage pins providing voltages higher than provided by a pin electronics driver. In another example, amplifier 66 may be supplied by another voltage source on IC chip 30 than $V_{TERM}$.

Elements of different embodiments described herein may be combined to form other embodiments not specifically set forth above. Other embodiments not specifically described herein are also within the scope of the following claims.

What is claimed is:

1. An integrated circuit (IC) for use in testing a device, comprising:
    a pin electronics (PE) driver having an output;
    a pin; and
    a buffer connected to the output of the PE driver and the pin;
    wherein a first voltage measured at the pin is greater than a second voltage measured at the output;
    wherein the buffer comprises a first amplifier having an input connected to a voltage source and a second amplifier having an input connected to the output of the PE driver; and
    wherein the buffer comprises a switching mechanism configured to establish, in a first mode, a first electrical connection between the first amplifier and the pin, and, in a second mode, to establish a second electrical connection between the second amplifier and the pin.

2. The IC of claim 1, wherein the voltage source corresponds to a terminal voltage used by the PE driver.

3. The IC of claim 1, wherein a gain of the first amplifier is greater than one.

4. The IC of claim 1, wherein a gain of the second amplifier is about one.

5. The IC of claim 1, wherein the first mode and the second mode are mutually exclusive.

6. The IC of claim 1, wherein the pin electronics driver is tri-stated and includes an enable input signals and the switching mechanism includes an input signal to establish the first mode or the second mode, the input signal of the switching mechanism and the enable input signal being the same.

7. The IC of claim 1, wherein the switching mechanism comprises a first switch and a second switch.

8. Automatic test equipment (ATE) for use with a device under test, the ATE comprising:
    an integrated circuit (IC) comprising:

a pin electronics (PE) driver having an output having a second voltage;

a high voltage pin having a first voltage that is greater than the second voltage; and a buffer connected to the output of the PE driver and to the high voltage pin, wherein the buffer comprises:
 a first amplifier having an input connected to the output of the PE driver;
 a second amplifier having an input connected to a termination voltage; and
 a switching mechanism configured to establish, in a first mode, a first electrical connection between the first amplifier and the high voltage pin, and, in a second mode, to establish a second electrical connection between the second amplifier and the high voltage pin.

9. The ATE of claim 8, wherein the first amplifier has a gain of about one.

10. The ATE of claim 8, wherein the second amplifier has a gain greater than one.

11. The ATE of claim 8, wherein the pin electronics driver is tri-stated and includes an enable input signal, and the switching mechanism includes an input signal to establish the first mode or the second mode, the input signal of the switching mechanism and the enable input signal being the same.

12. A method of testing a device, comprising:

connecting an output of a pin electronics (PE) driver to a buffer, wherein the buffer comprises:
 a first amplifier having a gain of about one, the first amplifier including an input connected to an output of the PE driver; and
 a second amplifier having a gain greater than one, the second amplifier including an input connected to a voltage source;

connecting the buffer to a pin;

receiving a signal indicating a first mode or a second mode;

in the first mode, establishing a first electrical connection between the first amplifier and the pin; and in the second mode, establishing a second electrical connection between the second amplifier and the pin; and providing a first voltage at the pin greater than a second voltage at the output of the PE driver.

13. The method of claim 12, wherein the first mode and the second mode are mutually exclusive.

* * * * *

UNITED STATES PATENT AND TRADEMARK OFFICE
CERTIFICATE OF CORRECTION

| | | |
|---|---|---|
| PATENT NO. | : 7,102,375 B2 | Page 1 of 1 |
| APPLICATION NO. | : 11/023023 | |
| DATED | : September 5, 2006 | |
| INVENTOR(S) | : Ernest P. Walker | |

It is certified that error appears in the above-identified patent and that said Letters Patent is hereby corrected as shown below:

Column 6, Claim 6, Line 58;
Delete "signals" and Insert --signal,--

Signed and Sealed this
Twenty-fifth Day of December, 2012

David J. Kappos
*Director of the United States Patent and Trademark Office*